United States Patent
Groiss et al.

(10) Patent No.: US 11,722,053 B2
(45) Date of Patent: Aug. 8, 2023

(54) OVER CURRENT PROTECTION CONCEPT FOR NEGATIVE LOAD CURRENT OF POWER DEVICE GATE DRIVERS

(71) Applicant: Infineon Technologies Austria AG, Villach (AT)

(72) Inventors: Stefan Hermann Groiss, Landskron (AT); Emanuele Bodano, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/560,382

(22) Filed: Dec. 23, 2021

(65) Prior Publication Data

US 2023/0208280 A1    Jun. 29, 2023

(51) Int. Cl.
 H02M 1/32    (2007.01)
 H03K 17/082  (2006.01)
 H03K 5/24    (2006.01)

(52) U.S. Cl.
 CPC ............... *H02M 1/32* (2013.01); *H03K 5/24* (2013.01); *H03K 17/0822* (2013.01)

(58) Field of Classification Search
 CPC ................ H02M 1/32; H02H 9/02; H03K 17/082–0828
 See application file for complete search history.

(56) References Cited

U.S. PATENT DOCUMENTS

| | | | |
|---|---|---|---|
| 7,880,455 B2* | 2/2011 | Wu | H02M 1/32 323/284 |
| 9,276,530 B1 | 3/2016 | Liu et al. | |
| 9,551,742 B2 | 1/2017 | Huang | |
| 10,389,108 B2 | 8/2019 | Duvnjak | |
| 2015/0244164 A1 | 8/2015 | Li et al. | |
| 2015/0311780 A1* | 10/2015 | Tomas | H02H 7/1225 363/50 |
| 2019/0238123 A1* | 8/2019 | Yamanaka | H02H 7/20 |

FOREIGN PATENT DOCUMENTS

JP    2001309657 A    11/2001

OTHER PUBLICATIONS

Extended European Search Report for Application No. EP22207487.4, dated Apr. 24, 2023, 8 pages.

* cited by examiner

*Primary Examiner* — Jared Fureman
*Assistant Examiner* — Christopher J Clark
(74) *Attorney, Agent, or Firm* — Harrity & Harrity, LLP (57) ABSTRACT

A method is provided for driving a half bridge circuit that includes a first transistor and a second transistor that are switched in a complementary manner. The method includes generating an off-current during a plurality of turn-off switching events to control a gate voltage of the second transistor; measuring a transistor parameter of the second transistor during a first turn-off switching event during which the second transistor is transitioned to an off state, wherein the transistor parameter is indicative of an oscillation at the first transistor during a corresponding turn-on switching event during which the first transistor is transitioned to an on state; and activating a portion of the off-current for the second turn-off switching event, including regulating an interval length of the second portion for the second turn-off switching event based on the measured transistor parameter measured during the first turn-off switching event.

27 Claims, 3 Drawing Sheets

OVER CURRENT PROTECTION CONCEPT FOR NEGATIVE LOAD CURRENT OF POWER DEVICE GATE DRIVERS

BACKGROUND

In switched mode power supplies (SMPS), fault protection may be used to protect against load overcurrent. If a short at the load or somewhere else in the system occurs, the load current can increase nearly unlimited and damage system components. Accordingly, systems are typically designed to be protected against such an event. Otherwise, an uncontrolled temperature increase and overvoltage stress with or without destruction of the system is likely going to occur.

Power transistors arranged in a half bridge may be used to drive a load and are more particularly used to control a positive load current flowing to the load and a negative load current flowing from the load. In most cases, the load current is flowing in positive direction so that energy is transported to the load. In some cases, it can happen that negative load current starts flowing. For positive load current flow there exist some concepts for positive overcurrent protection while for negative load current there are few negative overcurrent protection schemes available. For those protection schemes that provide both positive overcurrent protection and negative overcurrent protection, separate protection circuitries are provided, which results in larger area and higher complexity that translate into higher costs.

Moreover, current negative overcurrent protection schemes provide protection by redirecting negative load current through the body diode of the high-side power transistor by keeping both high-side and low-side transistors turned off. The disadvantage of that strategy is that the quite huge negative load current at this moment (e.g., −50 A) flows through the body diode high-side transistor with a certain voltage drop over it (e.g., 0.5V) which results in high power dissipation in the body diode of the high-side transistor (e.g., in this example, 50 A*0.5V=25 W) for a certain period of time. This can have a negative effect on the thermal performance of the system, leading to overheating, and also negatively impact the lifetime of the system components because repetitive negative load current events may happen arbitrarily often during the lifetime. Therefore, the lifetime may be limited due to permanent thermal over stress of the system. Furthermore, since the low-side switch-off is normally very fast, the low-side drain will see a large overvoltage due to the parasitic inductance. This overvoltage increases with the current and an unlimited current would create spikes which would reach the low-side break down voltage and will create electrical overstress.

Therefore, an improved system that reduces power loss during a negative overcurrent protection may be desirable. Furthermore, a system that provides both positive overcurrent protection and negative overcurrent protection while reducing the amount of area and complexity of the protection circuits may also be desirable.

SUMMARY

One or more embodiments provide a gate driver system configured to drive a load, the gate driver system configured to drive a half bridge circuit including a high-side transistor and a low-side transistor. The gate driver system includes: a gate driver circuit configured to drive the high-side transistor and the low-side transistor between switching states based on at least one control signal to control a load current, wherein the load current is a positive load current when it flows towards the load and is a negative load current when it flows away from the load; a control circuit configured to regulate the at least one control signal in response to detecting a negative load overcurrent event, wherein the control circuit is configured to monitor for the negative load overcurrent event and detect the negative load overcurrent event in response to the load current being less than a negative overcurrent threshold, and wherein, in response to detecting the negative load overcurrent event, the control circuit is configured to turn off the low-side transistor and turn on the high-side transistor such that the negative load current flows through a gate-controlled conductive channel of the high-side transistor.

One or more embodiments provide a method of driving a half bridge circuit including a first transistor and a second transistor. The method includes driving the high-side transistor and the low-side transistor between switching states based on at least one control signal to control a load current, wherein the load current is a positive load current when it flows towards the load and is a negative load current when it flows away from the load; monitoring for a negative load overcurrent event; detecting the negative load overcurrent event in response to the load current being less than a negative overcurrent threshold; and regulating the at least one control signal in response to detecting the negative load overcurrent event, including, in response to detecting the negative load overcurrent event, turning off the low-side transistor and turning on the high-side transistor such that the negative load current flows through a gate-controlled conductive channel of the high-side transistor.

BRIEF DESCRIPTION OF THE DRAWINGS

Embodiments are described herein making reference to the appended drawings.

DETAILED DESCRIPTION

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (i.e., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies, power modules, and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value. Accordingly, the load current path of a transistor is a gate-controlled conductive channel whose conductivity is controlled by the gate voltage of the transistor.

A power transistor, also referred to as a power switch or a transistor switch, is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn on the device. In contrast, during the turn-off process, the gate driver IC is used to draw (sink) a gate current (i.e., an off current) from the gate of the power transistor in order to discharge the gate voltage sufficiently to turn off the device. A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn on and off the power transistor, respectively.

For driving a load in this manner, two power transistors are typically arranged in a half-bridge configuration. A high-side power transistor, when on, is responsible for conducing load current in order to source the load current to the load while its complementary power transistor is turned off (i.e., the low-side power transistor is in blocking mode). In order to sink load current from the load, the roles of the two transistors are reversed. Here, the low-side power transistor, when on, is responsible for conducting load current in order to sink the load current from the load while its complementary power transistor is turned off (i.e., the high-side power transistor is in blocking mode). The two power transistors are typically switched such that both are not turned on at the same time. Specific embodiments described in this specification pertain to, without being limited thereto, power semiconductor devices that may be used within a power converter or a power supply. Half-bridges may be used for driving electric motors or switched mode power supplies.

Transistors may include Insulated Gate Bipolar Transistors (IGBTs) and Metal Oxide Semiconductor Field Effect Transistors (MOSFETs) (e.g., Si MOSFETs or SiC MOSFETs). It will be appreciated that MOSFETs may be substituted for IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage VDS may be substituted for the IGBT's collector-emitter voltage VCE in any one of the examples described herein. Thus, any IGBT module may be substituted by a MOSFET module and vice versa.

Figure 1:
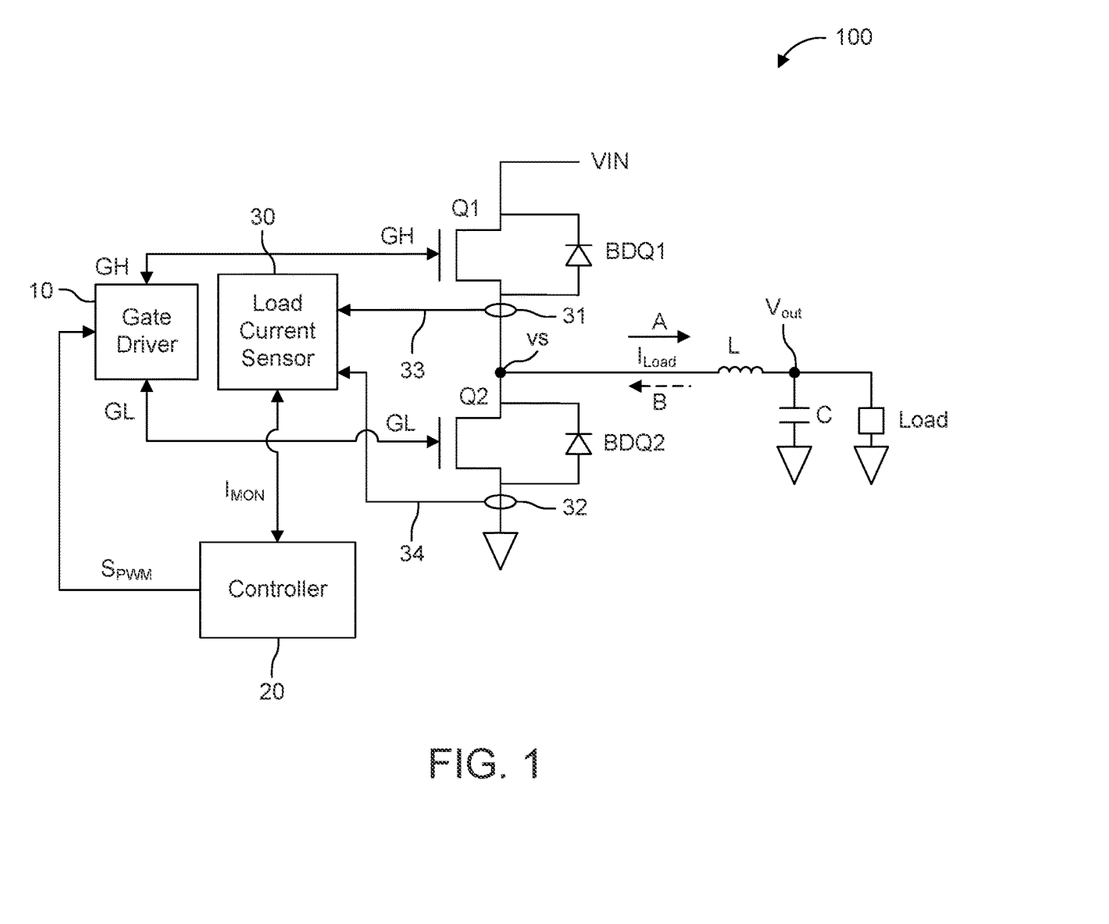
FIG. 1 is a schematic block diagram of a gate driver system according to one or more embodiments.

FIG. 1 is a schematic block diagram of a gate driver system 100 according to one or more embodiments. The gate driver system 100 includes a half-bridge that includes a high-side power transistor Q1 and a low-side power transistor Q2. The gate driver system 100 also includes a gate driver 10 electrically coupled to the gates of the power transistors Q1 and Q2, a controller 20 configured to provide at least one PWM control signal SPWM to the gate driver 10 that the gate driver 10 uses to generate gate driving signals GH and GL, and a load current sensor 30 that is configured to measure the load current ILOAD and generate a measurement signal Imon that is proportional to the measured load current ILOAD. The high-side power transistor Q1 and a low-power transistor Q2 are controlled for supplying the load current ILOAD to the load.

The power transistors Q1 and Q2 each include a respective freewheeling body diode BDQ1 and BDQ2 that provide a freewheeling current path (i.e., a reverse drain current path) that is connected in parallel to the gate-controlled conductive path of its respective transistor. A body diode is intrinsic to a transistor's structure—it is formed in the body-drain p-n junction connected between the drain and source.

The gate driver system 100 may be implemented in a switched mode power supply (SMPS). In this example, an inductor L and a capacitor C are coupled between the switching node Vs of the half-bridge and the load. Such an SMPS can be operated as a buck converter such that the output voltage Vout is smaller than the input voltage Vin. The gate driver system 100 is configured to convert the input voltage Vin into the output voltage Vout that is supplied to the load. The inductor L is used as a storage element and the capacitor C is used for stabilizing the output voltage Vout.

A positive load current flow is shown by arrow A, while negative load current flow is marked by arrow B. The voltage at the switching node Vs is equal to the input voltage Vin when the high-side transistor Q1 is on (and the low-side transistor Q2 is off) and is equal to a ground potential or a negative power supply rail potential when the low-side transistor Q2 is on (and the high-side transistor Q1 is off). This generally results in a positive load current when Q1 is on and Q2 is off and a negative load current when Q2 is on and Q1 is off. However, it is noted that the inductor L opposes change in the load current ILOAD. Thus, it is possible for a negative load current to flow through the gate-controlled conductive channel of the high-side transistor Q1 if the high-side transistor Q1 is turned on while a negative load current is flowing. It is possible for a negative load current to flow through the freewheeling current path of the high-side transistor Q1 (i.e., through body diode BDQ1) if both transistors Q1 and Q2 are turned off while a negative load current is flowing. The latter of which is intended to be avoided by the described embodiments in order to reduce power loss.

The gate driver 10 performs gate driving of power transistors Q1 and Q2 based on at least one control signal SPWM provided by a controller 20, such as a microcontroller. The controller 20 may generate a control signal SPWM that the gate driver 10 uses to derive driving signals GH and GL. Alternatively, the controller 20 may generate two PWM control signals, one intended to be used by the gate driver 10 to derive driving signal GH and one intended to be used by the gate driver 10 to derive driving signal GL. In particular, the gate driver 10 may use the at least one control signal SPWM to control an on/off state of positive and negative current sources that are used to generate the driving signals GH and GL as either positive or negative currents that either charge or discharge the gates of their respective power transistors Q1 and Q2.

The load current sensor 30 is a measurement circuit that measures the load current ILOAD and generates a measurement signal Imon (i.e., a monitoring signal) that is proportional to the measured load current ILOAD. A measuring circuit 31 or sensing circuit may be used to measure the load current ILOAD that flows through transistor Q1 and provide a sensing signal 33, while another measuring circuit 32 or sensing circuit may be used to measure the load current ILOAD that flows through transistor Q2 and provide a sensing signal 34. The measuring circuits 31 and 32 may each include a shunt resistor arrange in the load current path of each transistor and a circuit that measures the voltage drop across each shunt resistor to generate the measurement signal Imon. Alternatively, the measuring circuits 31 and 32 may include current mirrors that emulate the load current flowing through a respective power transistor. Alternatively, a voltage drop across Q1 and/or Q2 could be measured via drain-source voltage drop sensing. Accordingly, there are various ways to measure or sense the load current ILOAD in order to generate the measurement signal Imon and the embodiments are not limited to any particular measurement scheme.

In the following examples, the measurement signal Imon is a current signal that is proportional to the measured load current ILOAD. The load current sensor 30 may be configured to provide the measurement signal Imon to the controller 20 that may use the measurement signal Imon to regulate the one or more PWM control signals SPWM, and, more particularly, to regulate the on/off states of the power transistors Q1 and Q2.

Figure 2:
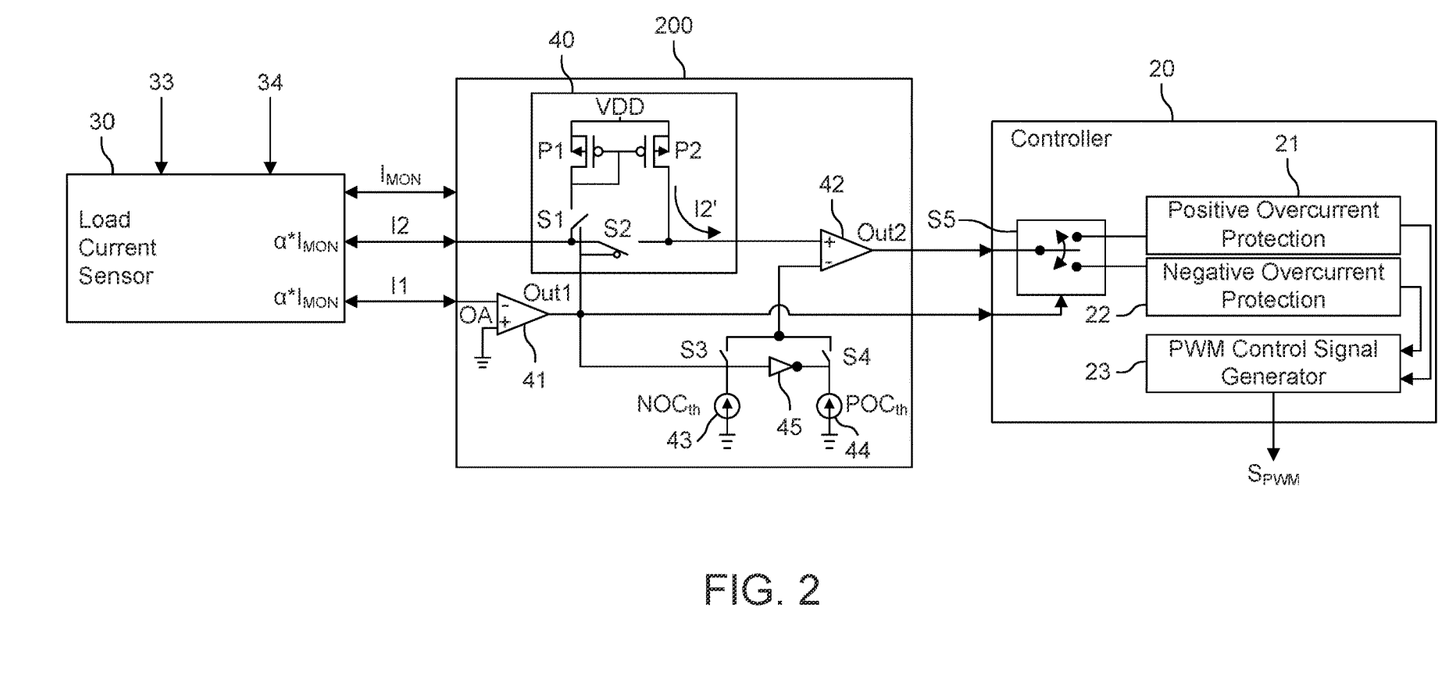
FIG. 2 is a schematic diagram of an overcurrent detection circuit implemented in the gate driver system according to one or more embodiments.

FIG. 2 is a schematic block diagram of an overcurrent detection circuit 200 implemented in the gate driver system 100 according to one or more embodiments. The overcurrent detection circuit 200 is interposed between the load current sensor 30 and the controller 20. Alternatively, the overcurrent detection circuit 200 may be integrated with the controller 20. The overcurrent detection circuit 200 is a single integrated circuit that is configured for detecting both positive and negative overcurrents.

In addition to measurement signal (i.e., monitoring signal) Imon, the load current sensor 30 is configured to generate two additional measurement signals I1 and I2 by multiplying measurement signal Imon by a predetermined factor α. In this case, the same factor α is used for generating both measurement signals I1 and I2. Accordingly, measurement signals I1 and I2 are equal to each other and provide the same measurement values. However, it will be appreciated that different factors could be also used for generating measurement signals I1 and I2 and therefore may have different measurement values. It will also be appreciated that a single measurement signal could be generated instead of two measurement signals or even measurement signal Imon could be used. Like measurement signal Imon, measurement signals I1 and I2 are current signals with a current flow direction that flows out of the load current sensor 20 when positive and flow into (i.e., pulled into) the load current sensor 30 when negative. Thus, measurement signals I1 and I2 can flow towards or away from the overcurrent detection circuit 200.

The overcurrent detection circuit 200 includes a current inverting circuit 40, a current comparator 41, a current comparator 42, a current source 43 that provides a negative overcurrent threshold NOCth, a current source 44 that provides a positive overcurrent threshold POCth, an inverter 45, a switch network that includes switches S1, S2, S3, and S4.

A current comparator, in general, is capable of comparing two positive currents (i.e., two currents that flow into the inverting and non-inverting terminals), comparing two negative currents (i.e., two currents that flow out of the inverting and non-inverting terminals), or comparing a positive or negative current to zero current. Thus, a current comparator cannot compare a negative current with a positive current. This principle becomes important when using current comparator 42. Each current comparator includes a monitoring terminal (a first one of an inverting or non-inverting termi-nals) at which a measurement signal is present, a reference terminal (a second one of the inverting or non-inverting terminals) at which a reference signal corresponding to a predetermined threshold is present, and an output terminal at which a comparison result is indicated.

The current comparator 41 is configured as an inverting comparator since a reference threshold OA is provided to its non-inverting terminal and the measurement signal I1 is provided at its inverting terminal. The current comparator 41 is configured to compare a value of the measurement signal I1 to a predetermined threshold of OA in order to generate a comparator signal Out1 that indicates whether the load current is a positive load current or a negative load current. For example, since measurement signal I1 is proportional the load current ILOAD, when the measurement signal I1 is flowing into the current comparator 41 and thus is greater than the predetermined threshold of OA, it is indicative of a positive load current. When the measurement signal I1 is flowing out of the current comparator 41 (i.e., into the load current sensor 30) and thus is less than the predetermined threshold of OA, it is indicative of a negative load current. The comparator signal Out1 is low when the measurement signal I1 is greater than the predetermined threshold of OA and is high when the measurement signal I1 is less than the predetermined threshold of OA.

The comparator signal Out1 is used as a control signal to control the state of the switches S1, S2, S3, S4 of the overcurrent detection circuit 200, as well as the state of switch S5 in the controller 20. Switches S1 and S2 are operating in a complementary manner based on comparator signal Out1. This means that when one switch is open, the other switch is closed. Likewise, switches S3 and S4 are operated in a complementary manner based on comparator signal Out1 and inverter 45. The inverter 45 is used to invert the comparator signal Out1 going to switch S4 so that switches S3 and S4 receive control signals that are inverted with respect to each other.

When the load current is positive and the comparator signal Out1 is low, switch S1 is open, switch S2 is closed, switch S3 is open, and switch S4 is closed. When the load current is negative and the comparator signal Out1 is high, switch S1 is closed, switch S2 is open, switch S3 is closed, and switch S4 is open.

Moreover, comparator signal Out1 is used as a control signal to control the state of switch S5 in the controller 20. Switch S5 is used to configure the controller into either positive overcurrent protection mode or negative overcurrent protection mode.

During positive overcurrent protection mode, switch S5 is configured to couple the output of current comparator 42 (i.e., comparator signal Out2) to a positive overcurrent protection circuit 21 that monitors for positive overcurrent events. The positive overcurrent protection circuit 21 may reduce the duty cycle of the one or more PWM control signals SPWM in response to detecting a positive overcurrent event. When the comparator signal Out1 is low, the output of current comparator 42 is connected to the positive overcurrent protection circuit 21 and the positive overcurrent protection circuit 21 monitors the comparator signal Out2 for an indication of a positive overcurrent event. The positive overcurrent protection circuit 21 provides control signals to a PWM control signal generator 23 based on whether a positive overcurrent event has occurred for controlling the PWM control signal(s) SPWM. The PWM control signal generator 23 regulates the PWM control signal(s) SPWM accordingly.

During negative overcurrent protection mode, switch S5 is configured to couple the output of current comparator 42 (i.e., comparator signal Out2) to a negative overcurrent protection circuit 22 that monitors for negative overcurrent events. The negative overcurrent protection circuit 22 turns on the high-side transistor Q1 and turns off the low-side transistor Q2 in response to detecting a negative overcurrent event such that the negative load current flows through the gate-controlled conductive channel of the high-side transistor Q1. When the comparator signal Out1 is high, the output of current comparator 42 is connected to the negative overcurrent protection circuit 22 and the negative overcurrent protection circuit 22 monitors the comparator signal Out2 for an indication of a negative overcurrent event. The negative overcurrent protection circuit 22 provides control signals to a PWM control signal generator 23 based on whether a negative overcurrent event has occurred for controlling the PWM control signal(s) SPWM. The PWM control signal generator 23 regulates the PWM control signal(s) SPWM accordingly.

The negative overcurrent protection circuit 22 is configured to trigger the turn on of the high-side transistor Q1 in response to detecting the negative load overcurrent event. The negative overcurrent protection circuit 22 also turns off the low-side transistor Q2, which may be done synchronously with the turn on of the high-side transistor Q1 or just prior to the turn on of the high-side transistor Q1 (i.e., Q2 may be turned on after a slight delay following the turn-off of Q2). For example, the negative overcurrent protection circuit 22 may be configured to immediately trigger the turn off of the low-side transistor Q2 in response to detecting the negative load overcurrent event and also turn on the high-side transistor either synchronously with the turn off of Q2 or after a slight delay. As a result, the negative overcurrent protection circuit 22 redirects the negative load current from flowing through a gate-controlled conductive channel of the low-side transistor Q2 to flowing through the gate-controlled conductive channel of the high-side transistor Q1.

As noted above, when the load current is positive and the comparator signal Out1 is low, switch 1 is open, switch S2 is closed, switch S3 is open, and switch S4 is closed. Because switch 1 is open and switch S2 is closed, the measurement signal I2, which has a positive flow, is provided to the non-inverting input of the current comparator 42. Additionally, current source 44 is connected to the inverting input of the current comparator 42. In this case, two positive currents are input to the current comparator 42 for comparison. The current comparator 42 is configured to compare the value of measurement signal I2 to the threshold POCth during positive load overcurrent protection in order to generate comparator signal Out2 that indicates whether or not the load current is greater than a positive overcurrent threshold. If the value of measurement signal I2 is greater than the threshold POCth, a positive overcurrent threshold event has occurred and comparator signal Out2 switches, for example, from low to high indicating that a positive overcurrent threshold event has occurred. Thus, the comparator signal Out2 indicates whether or not the load current ILOAD is greater than a positive overcurrent threshold.

As noted above, when the load current is negative and the comparator signal Out1 is high, switch 1 is closed, switch S2 is open, switch S3 is closed, and switch S4 is open. Because switch S1 is closed and switch S2 is open, the negative measurement signal I2 flows from the current mirror of the current inverting circuit 40 via transistor P1 into the load current sensor 30. The current mirror of the current inverting circuit 40 is comprised of two PMOS transistors P1 and P2 coupled to voltage source VDD. The action of measurement signal I2 being pulled down by the load current sensor 30 through transistor P1 causes an inverted measurement current I2' being generated on the other side of the current mirror that is pulled down from voltage source VDD through transistor P2 to the non-inverting terminal of the current comparator 42. In other words, the current inverting circuit 40 inverts the flow of current at the non-inverting terminal of the current comparator 42 that would have otherwise been negative in the event of a negative load current. In the case of a negative load current, measurement current I2 is a negative current and inverted measurement current I2' is a positive current with respect to the non-inverting terminal of the current comparator 42.

The inverted measurement current I2' is a current that flows from the current mirror into the non-inverting terminal of the current comparator 42 that is proportional in magnitude to measurement signal I2. The magnitudes of measurement signal I2 and inverted measurement current I2' may be equal depending on the sizing of transistors P1 and P2. The current inverting circuit 40 ensures that current is always flowing into the non-inverting terminal of the current comparator 42. Likewise, two reference current sources 43 and 44 generate current which always flows into the inverting terminal of comparator 42.

Thus, using the non-inverting terminal of the current comparator 42 as a reference point, it can be said that the measurement current I2 and the inverted measurement current I2' flow in opposite directions. The direction change at the non-inverting terminal of the current comparator 42 allows the inverted measurement current I2' to be compared with a negative reference current NOCth generated by current source 43 for detecting negative overcurrent events. It is noted that the inverted measurement current I2' may also be equal in magnitude to measurement signal I1 if the same factor α is applied by the load current sensor 30.

Additionally, current source 43 is connected to the inverting input of the current comparator 42. In this case, two positive currents are flowing into of the input terminals of the current comparator 42 for comparison. The current comparator 42 is configured to compare the value of measurement signal I2' to the threshold NOCth during negative load overcurrent protection in order to generate comparator signal Out2 that indicates whether or not the negative load current is less than (i.e., more negative than) a negative overcurrent threshold (e.g., whether the measurement signal I2' is greater than the threshold NOCth). When the measurement signal I2' is exceeds the threshold NOCth, it means the negative load current has become more negative than a negative overcurrent threshold or, said in another way, that the magnitude of the negative load current is greater that the magnitude of the negative overcurrent threshold. If the value of measurement signal I2' is greater than the threshold NOCth, a negative overcurrent threshold event has occurred and comparator signal Out2 switches, for example, from low to high indicating that a negative overcurrent threshold event has occurred. Thus, the comparator signal Out2 indicates whether or not the load current ILOAD is less than a negative overcurrent threshold.

The current mirror of the current inverting circuit 40 is disabled via the opening of switch S1 on a condition that the comparator signal Out1 indicates that the load current ILOAD is a positive load current and is enabled via the closing of switch S1 on a condition that the comparator signal Out1 indicates that the load current ILOAD is a negative load current. When enabled, the current mirror of the current inverting circuit 40 is configured to "receive" the measurement signal I2 and generate an inverted measurement signal I2' that has the same magnitude as measurement signal I2. When the load current ILOAD is a negative load current, the current comparator 42 is configured to compare the inverted measurement signal I2' to threshold NOCth to generate the comparator signal Out2 that indicates whether or not the load current ILOAD is less than a negative overcurrent threshold. When the load current ILOAD is a positive load current, the current comparator 42 is configured to compare the measurement signal I2 to threshold POCth to generate the comparator signal Out2 that indicates whether or not the load current ILOAD is greater than a positive overcurrent threshold.

The current comparator 42 includes a first comparator terminal (e.g., a non-inverting terminal) to which the measurement signal I2 or the inverted measurement signal I2' is provided and a second comparator terminal (e.g., an inverting terminal) to which threshold POCth or threshold NOCth is provided. The current mirror of the current inverting circuit 40 is configured to invert the flow of current at the first comparator terminal. Due to the complementary state of switches S1 and S2, when the load current is a positive load current, the measurement signal is configured to bypass the current inverting circuit and the current comparator 42 is configured to receive the measurement signal I2. However, when the load current is a negative load current, the current mirror of the current inverting circuit 40 is configured to source the inverted measurement signal I2' to the current comparator 42.

It is noted that switches S3 and S4, threshold current sources 43 and 44, and inverter 45 make up a threshold circuit configured to switchably provide the POC threshold or the NOC threshold to the current comparator 42. The POC threshold may be greater than, equal to, or less than the NOC threshold depending on the desired levels of positive and negative overcurrent protections. In particular, the threshold circuit is configured to receive the comparator signal Out1, provide the NOC threshold to the current comparator 42 on a condition that the comparator signal Out1 indicates that load current is the negative load current, and provide the POC threshold to the current comparator 42 on a condition that the comparator signal Out1 indicates that load current is the positive load current.

In response to detecting the negative load overcurrent event based on Out2, the negative overcurrent protection circuit 22 is configured to turn off the low-side transistor Q2 and turn on the high-side transistor Q1 for a protection interval that is equal up to a maximum of a predetermined time interval.

In response to detecting the negative load overcurrent event, the negative overcurrent protection circuit 22 is configured to override an output of the PWM control signal SPWM in order to turn on the high-side transistor for the protection interval. As a result, the PWM control signal generator 23 does not output the PWM control signal but instead outputs a modified control signal that turns on the high-side transistor Q1 and turns off the low-side transistor Q2. It can be said that the PWM control signal under this circumstance is interrupted and modified control signal is provided to the gate driver 10. However, the PWM control signal generator 23 continues to monitor the PWM control signal SPWM internally.

Additionally, the PWM control signal generator 23 is configured to monitor for a transition edge of the PWM control signal (e.g., a falling edge or a rising edge) and reinstate the PWM control signal SPWM for controlling the high-side transistor and the low-side transistor in response to detecting the transition edge of the PWM signal. That is, if the transition edge of the PWM control signal SPWM does not occur during the predetermined time interval, the protection period is equal to the predetermined time interval. In this case, the protection period extends for the maximum amount of time defined by the predetermined time interval before normal operation via the PWM control signal SPWM is resumed. On other hand, if the PWM control signal generator 23 detects the transition edge of the PWM control signal during the protection period and thereby prior to a lapse of the predetermined time interval, the PWM control signal generator 23 is configured to terminate the protection period at a time instance at which it detects the transition edge of the PWM control signal. When the protection period is terminated, the PWM control signal generator 23 reinstate the PWM control signal SPWM for controlling the high-side transistor and the low-side transistor by outputting it to the gate driver 10. Thus, a transition edge of the PWM control signal that occurs during the protection period of a negative overcurrent event reduces the length of the protection period.

Switches S1 and S2, the current mirror consisting of P1 and P2, and the threshold circuit (elements S3, S4, 43, 44, and 45) enables the overcurrent detection circuit 200 to use the same comparator (i.e., comparator 42) for performing both positive and negative overcurrent protection. This allows minimizing hardware implementation area. Moreover, by redirecting the negative load current through the gate-controlled conductive channel of transistor Q1, power dissipation losses can be reduced when a negative overcurrent event occurs while protecting the gate driver system 100.

Figure 3:
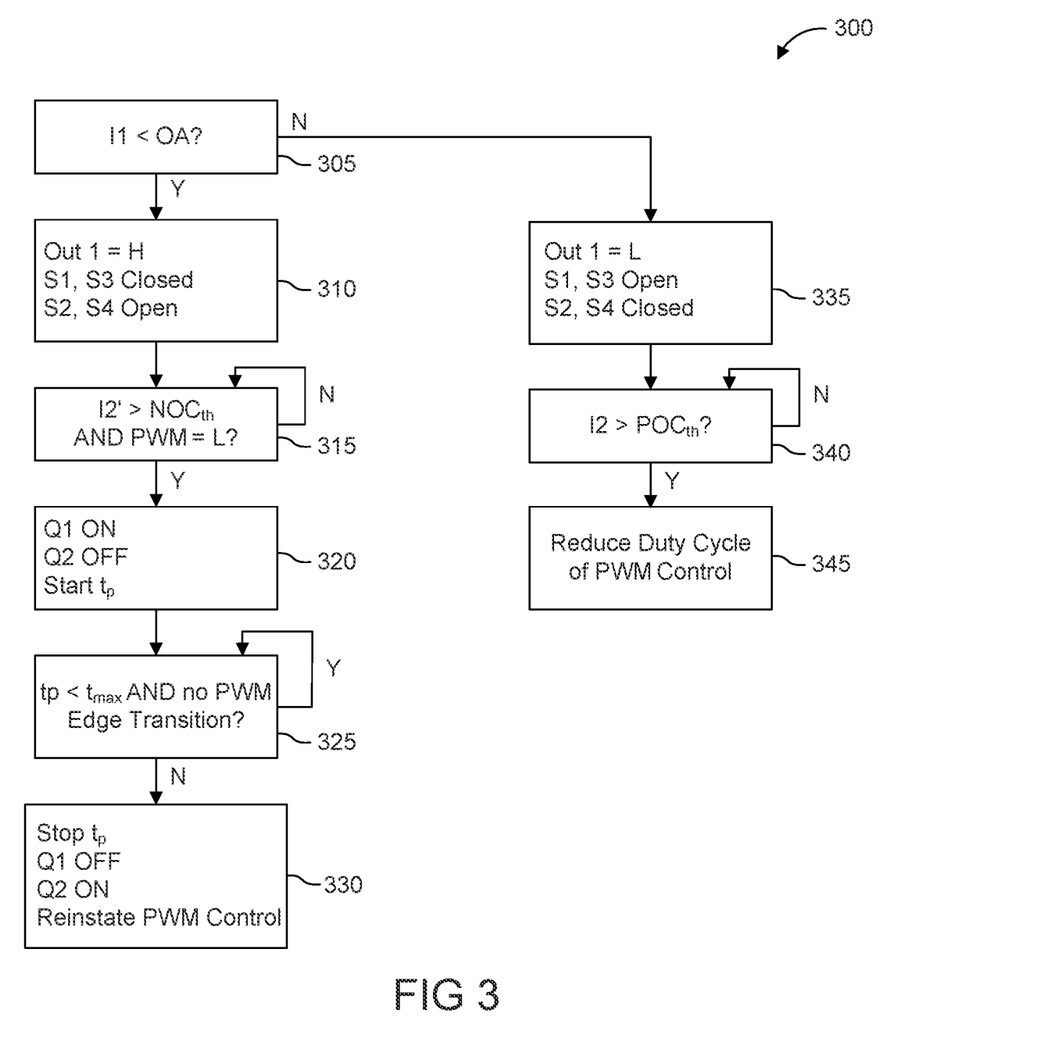
FIG. 3 is a flow diagram of a negative and positive overcurrent protection method according to one or more embodiments.

FIG. 3 is a flow diagram of a negative and positive overprotection method 300 according to one or more embodiments. At operation 305, measurement signal I1 is compared to a threshold value of zero (0A) and the method proceeds to operation 310 if the measurement signal I1 is less than zero (i.e., is a negative value). In operation 310, comparator signal Out1 is high, causing switches S1 and S3 to close and switches S2 and S4 to open, thereby enabling the current mirror of the inverting current circuit 40 and enabling NOCth at comparator 42. In operation 315, the inverted measurement current I2' is compared with NOCth. If the inverted measurement current I2' is greater than NOCth while the PWM control signal SPWM is low (operation 315=Y), transistor Q1 is turned on and transistor Q2 is turned off (operation 320). Otherwise, operation 315 repeats (operation 315=N). The condition "while the PWM control signal SPWM is low" ensures that Q2 is currently turned on and Q1 is currently turned off such that the transistor states can be switched in operation 320.

A negative overcurrent protection interval tp is also started in operation 320, during which Q1 is maintained on and transistor Q2 is maintained off (operation 325=Y) until the negative overcurrent protection period is terminated (operation 325=N). In operation 325, the negative overcurrent protection interval tp is compared to a maximum predetermined time interval tmax (e.g., 200 ns) and edge transitions of the PWM control signal are monitored. For example, the controller 20 may monitor for whether a falling edge transition of the PWM control signal occurs during the maximum predetermined time interval tmax. If either the negative overcurrent protection interval tp becomes equal to the maximum predetermined time interval tmax or a falling edge transition of the PWM control signal occurs before the negative overcurrent protection interval tp becomes equal to the maximum predetermined time interval tmax, the negative overcurrent protection period is terminated (operation 325=N). At this time, the negative overcurrent protection interval tp is stopped, transistor Q1 is turned off, transistor Q2 is turned on, and PWM control is reinstated (operation 330).

Alternatively, in operation 325, hysteresis could be used by observing current I2. Operation 325 repeats (Y) as long as I2' is greater than NOCth-NOCth_hysteresis AND "No PWM edge transition" is detected. Otherwise, the method proceeds to operation 330.

The method proceeds to operation 335 if the measurement signal I1 is equal to or greater than zero (i.e., is zero or is a positive value). In operation 335, comparator signal Out1 is low, causing switches S1 and S3 to open and switches S2 and S4 to close, thereby disabling the current mirror of the inverting current circuit 40 and enabling POCth at comparator 42. At operation 340, the measurement signal I2 is compared to POCth. If the measurement signal I2 is greater than POCth (operation 340=Y), a positive overcurrent event is detected and the duty cycle of the PWM control signal SPWM is reduced (operation 345). Otherwise, the measurement signal I2 continues to be monitored against POCth (operation 340=N).

One or more embodiments provide a gate driver system configured to drive a load, the gate driver system configured to drive a half bridge circuit including a high-side transistor and a low-side transistor. The gate driver system includes: a gate driver circuit configured to drive the high-side transistor and the low-side transistor between switching states based on at least one control signal to control a load current, wherein the load current is a positive load current when it flows towards the load and is a negative load current when it flows away from the load; a measurement circuit configured to generate a first measurement signal and a second measurement signal that are proportional to the load current; a first comparator circuit configured to compare the first measurement signal to a first threshold in order to generate a first comparator signal that indicates whether the load current is the positive load current or the negative load current; a second comparator circuit configured to generate a second comparator signal that indicates whether or not the load current is less than the negative overcurrent threshold when the load current is the negative load current and that indicates whether or not the load current is greater than a positive overcurrent threshold when the load current is the positive load current; and a current inverting circuit that is disabled on a condition that the first comparator signal indicates that the load current is the positive load current and is enabled on a condition that the first comparator signal indicates that the load current is the negative load current, wherein, when enabled, the current inverting circuit is configured to receive the second measurement signal and generate an inverted measurement signal that is equal but opposite to the measurement signal, wherein, when the load current is the negative load current, the second comparator circuit is configured to compare the inverted measurement signal to a second threshold to generate the second comparator signal that indicates whether or not the load current is less than the negative overcurrent threshold, and wherein, when the load current is the positive load current, the second comparator circuit is configured to compare the second measurement signal to a third threshold to generate the second comparator signal that indicates whether or not the load current is greater than the positive overcurrent threshold.

While various embodiments have been disclosed, it will be apparent to those skilled in the art that various changes and modifications can be made which will achieve some of the advantages of the concepts disclosed herein without departing from the spirit and scope of the invention. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A gate driver system configured to drive a load, the gate driver system configured to drive a half bridge circuit comprising a high-side transistor and a low-side transistor, the gate driver system comprising:
a gate driver circuit configured to drive the high-side transistor and the low-side transistor between switching states based on at least one control signal to control a load current, wherein the load current is a positive load current when it flows towards the load and is a negative load current when it flows away from the load;
a control circuit configured to regulate the at least one control signal in response to detecting a negative load overcurrent event,
wherein the control circuit is configured to monitor for the negative load overcurrent event and detect the negative load overcurrent event in response to the load current being less than a negative overcurrent threshold, and wherein, in response to detecting the negative load overcurrent event, the control circuit is configured to turn off the low-side transistor and turn on the high-side transistor such that the negative load current flows through a gate-controlled conductive channel of the high-side transistor.

2. The gate driver system of claim 1, wherein the control circuit is configured to trigger the turn on of the high-side transistor in direct response to detecting the negative load overcurrent event.

3. The gate driver system of claim 1, wherein in response to detecting the negative load overcurrent event, the control circuit is configured to turn off the low-side transistor and turn on the high-side transistor such that the negative load current is redirected from flowing through a gate-controlled conductive channel of the low-side transistor to flowing through the gate-controlled conductive channel of the high-side transistor.

4. The gate driver system of claim 1, wherein the high-side transistor comprises a load path terminal that is coupled to an input voltage, wherein the gate driver system is configured to convert the input voltage to an output voltage that is supplied to the load.

5. The gate driver system of claim 1, further comprising:
a measurement circuit configured to generate a first measurement signal that is proportional to the load current; and
a first comparator circuit configured to compare a value of the first measurement signal to a first threshold in order to generate a first comparator signal that indicates whether the load current is the positive load current or the negative load current,
wherein the control circuit is configured to receive the first comparator signal and perform negative load overcurrent protection on a condition that the first comparator signal indicates that the load current is the negative load current,
wherein the control circuit is configured to monitor for the negative load overcurrent event during the negative load overcurrent protection.

6. The gate driver system of claim 5, wherein the control circuit is configured to perform positive load overcurrent protection on a condition that the first comparator signal indicates that the load current is the positive load current, and regulate the at least one control signal in response to detecting a positive load overcurrent event or the negative load overcurrent event.

7. The gate driver system of claim 5, wherein the measurement circuit is configured to generate a second measurement signal that is proportional to the load current, and the gate driver system further comprises:
a second comparator circuit configured to compare a value of the second measurement signal to a second threshold during the negative load overcurrent protection in order to generate a second comparator signal that indicates whether or not the load current is less than the negative overcurrent threshold.

8. The gate driver system of claim 7, wherein the second comparator circuit is configured to compare the value of the second measurement signal to a third threshold during a positive load overcurrent protection in order to generate the second comparator signal that indicates whether or not the load current is greater than a positive overcurrent threshold.

9. The gate driver system of claim 8, further comprising:
a threshold circuit configured to switchably provide the second threshold or the third threshold to the second comparator circuit, wherein the threshold circuit is configured to receive the first comparator signal, provide the second threshold to the second comparator circuit on a condition that the first comparator signal indicates that load current is the negative load current, and provide the third threshold to the second comparator circuit on a condition that the first comparator signal indicates that load current is the positive load current.

10. The gate driver system of claim 8, wherein the control circuit is configured to perform the positive load overcurrent protection on a condition that the first comparator signal indicates that the load current is the positive load current.

11. The gate driver system of claim 5, further comprising:
a second comparator circuit configured to compare the value of the first measurement signal to a second threshold during the negative load overcurrent protection in order to generate a second comparator signal that indicates whether or not the load current is less than the negative overcurrent threshold.

12. The gate driver system of claim 11, wherein the second comparator circuit is configured to compare the value of the first measurement signal to a third threshold during a positive load overcurrent protection in order to generate the second comparator signal that indicates whether or not the load current is greater than a positive overcurrent threshold.

13. The gate driver system of claim 12, further comprising:
a threshold circuit configured to switchably provide the second threshold or the third threshold to the second comparator circuit, wherein the threshold circuit is configured to receive the first comparator signal, provide the second threshold to the second comparator circuit on a condition that the first comparator signal indicates that load current is the negative load current, and provide the third threshold to the second comparator circuit on a condition that the first comparator signal indicates that load current is the positive load current.

14. The gate driver system of claim 12, wherein the control circuit is configured to perform the positive load overcurrent protection on a condition that the first comparator signal indicates that the load current is the positive load current.

15. The gate driver system of claim 1, wherein, in response to detecting the negative load overcurrent event, the control circuit is configured to turn on the high-side transistor for a protection interval that is equal up to a maximum of a predetermined time interval.

16. The gate driver system of claim 15, wherein the at least one control signal includes a pulse width modulated (PWM) signal configured to control the switching states of the high-side transistor and the low-side transistor,
wherein, in response to detecting the negative load overcurrent event, the control circuit is configured to override an output of the PWM signal in order to turn on the high-side transistor for the protection interval.

17. The gate driver system of claim 16, wherein the control circuit is configured to monitor for a transition edge of the PWM signal and reinstate the PWM signal for controlling the high-side transistor and the low-side transistor in response to detecting the transition edge of the PWM signal.

18. The gate driver system of claim 17, wherein:
if the transition edge of the PWM signal does not occur during the predetermined time interval, a protection period is equal to the predetermined time interval, and
if the control circuit detects the transition edge of the PWM signal during the protection period and thereby prior to a lapse of the predetermined time interval, the control circuit is configured to terminate the protection period at a time instance at which the control circuit detects the transition edge of the PWM signal.

19. The gate driver system of claim 1, further comprising:
a measurement circuit configured to generate a measurement signal that is proportional to the load current;
a comparator circuit configured to generate a comparator signal that indicates whether or not the load current is less than the negative overcurrent threshold; and
a current inverting circuit configured to receive the measurement signal and invert a current flow of the measurement signal relative to a monitoring terminal of the comparator circuit to generate an inverted measurement signal at the monitoring terminal,
wherein the comparator circuit is configured to compare a value of the inverted measurement signal to a first threshold in order to generate the comparator signal that indicates whether or not the load current is less than the negative overcurrent threshold,
wherein the control circuit is configured to receive the comparator signal and monitor for the negative load overcurrent event based on the comparator signal.

20. The gate driver system of claim 19, wherein:
the current inverting circuit comprises a current mirror, a first switch configured to disable the current mirror when the load current is the positive load current, and a second switch configured to enable the current mirror when the load current is the negative load current,
when the load current is the positive load current, the first switch is configured to close and the second switch is configured to open such that the measurement signal flows into the monitoring terminal of the comparator circuit, and
when the load current is the negative load current, the first switch is configured to open and the second switch is configured to close such that the measurement signal is pulled from the current mirror to thereby generate the inverted measurement signal that flows into the monitoring terminal of the comparator circuit.

21. The gate driver system of claim 20, wherein:
when the load current is the negative load current, the comparator circuit is configured to compare the inverted measurement signal to the first threshold to generate the comparator signal that indicates whether or not the load current is less than the negative overcurrent threshold, and
when the load current is the positive load current, the comparator circuit is configured to compare the measurement signal to a second threshold to generate the comparator signal that indicates whether or not the load current is greater than a positive overcurrent threshold.

22. The gate driver system of claim 1, further comprising:
a measurement circuit configured to generate a first measurement signal and a second measurement signal that are proportional to the load current;
a first comparator circuit configured to compare the first measurement signal to a first threshold in order to generate a first comparator signal that indicates whether the load current is the positive load current or the negative load current;
a second comparator circuit configured to generate a second comparator signal that indicates whether or not the load current is less than the negative overcurrent threshold when the load current is the negative load current and that indicates whether or not the load current is greater than a positive overcurrent threshold when the load current is the positive load current; and
a current inverting circuit that is disabled on a condition that the first comparator signal indicates that the load current is the positive load current and is enabled on a condition that the first comparator signal indicates that the load current is the negative load current,
wherein, when enabled, the current inverting circuit is configured to invert a current flow of the second measurement signal relative to a monitoring terminal of the second comparator circuit to generate an inverted measurement signal at the monitoring terminal,
wherein, when the load current is the negative load current, the second comparator circuit is configured to compare the inverted measurement signal to a second threshold to generate the second comparator signal that indicates whether or not the load current is less than the negative overcurrent threshold, and
wherein, when the load current is the positive load current, the second comparator circuit is configured to compare the second measurement signal to a third threshold to generate the second comparator signal that indicates whether or not the load current is greater than the positive overcurrent threshold.

23. The gate driver system of claim 22, wherein the second comparator circuit includes the monitoring terminal at which the second measurement signal or the inverted measurement signal is present and a reference terminal at which the second threshold or the third threshold is present, wherein the current inverting circuit is configured to invert a flow of current at the monitoring terminal.

24. The gate driver system of claim 22, wherein, when the load current is the positive load current, the second measurement signal is configured to bypass the current inverting circuit and the second comparator circuit is configured to receive the second measurement signal.

25. The gate driver system of claim 22, wherein, when the load current is the negative load current, the current inverting circuit is configured to generate the inverted measurement signal from the second measurement signal and provide the inverted measurement signal to the second comparator circuit.

26. The gate driver system of claim 22, wherein the first and the second comparator circuits are current comparators.

27. A method of driving a half bridge circuit comprising a first transistor and a second transistor, the method comprising:
driving a high-side transistor and a low-side transistor between switching states based on at least one control signal to control a load current, wherein the load current is a positive load current when it flows towards the load and is a negative load current when it flows away from the load;
monitoring for a negative load overcurrent event;
detecting the negative load overcurrent event in response to the load current being less than a negative overcurrent threshold; and
regulating the at least one control signal in response to detecting the negative load overcurrent event, including, in response to detecting the negative load overcurrent event, turning off the low-side transistor and turning on the high-side transistor such that the negative load current flows through a gate-controlled conductive channel of the high-side transistor.

* * * * *